(12) United States Patent
Kim et al.

(10) Patent No.: US 11,709,396 B2
(45) Date of Patent: Jul. 25, 2023

(54) DISPLAY DEVICE AND MANUFACTURING METHOD FOR THE SAME

(71) Applicant: Samsung Display Co., Ltd., Yongin-si (KR)

(72) Inventors: Soodong Kim, Hwaseong-si (KR); Youngsoo Kwon, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 160 days.

(21) Appl. No.: 17/186,452

(22) Filed: Feb. 26, 2021

(65) Prior Publication Data

US 2021/0382352 A1 Dec. 9, 2021

(30) Foreign Application Priority Data

Jun. 9, 2020 (KR) .................. 10-2020-0069437

(51) Int. Cl.
*G02F 1/13357* (2006.01)
*C09D 7/61* (2018.01)
(Continued)

(52) U.S. Cl.
CPC ......... *G02F 1/133606* (2013.01); *C09D 4/00* (2013.01); *C09D 7/20* (2018.01);
(Continued)

(58) Field of Classification Search
CPC ....... C09D 4/00; G02B 1/10; G02F 1/133514; H01K 2102/331; H10K 50/854; H10K 59/122
See application file for complete search history.

(56) References Cited

U.S. PATENT DOCUMENTS 10,185,066 B2 * 1/2019 Chae .................. H10K 59/38
10,439,167 B2 10/2019 Jo
(Continued)

FOREIGN PATENT DOCUMENTS

JP 5716805 B2 5/2015
JP 2020-19902 A 2/2020
(Continued)

OTHER PUBLICATIONS

Bagwe, Rahul P., et al. "Surface Modification of Silica Nanoparticles to Reduce Aggregation and Nonspecific Binding," Langmuir, 2006, Vo. 22, pp. 4357-4362.
(Continued)

*Primary Examiner* — Jessica M Merlin
(74) *Attorney, Agent, or Firm* — Lewis Roca Rothgerber Christie LLP

(57) ABSTRACT

A display device includes a light-emitting element layer and a light control layer. The light control layer may include a plurality of separated partition wall parts including a partition wall part, a color control part between the partition wall parts, the color control part including quantum dots and a first scattering particle, and a coating layer covering a side of the partition wall part adjacent to the color control part. The coating layer includes at least one selected from a substitution dispersant and a substitution scattering particle, and each of the substitution dispersant and the substitution scattering particle may include at least one substituent selected from an amine group and a carboxyl group. The amine groups and the carboxyl groups included in the coating layer may be different in number from each other.

20 Claims, 7 Drawing Sheets

(51) Int. Cl.

| | | |
|---|---|---|
| *C09D 7/20* | (2018.01) | |
| *C09D 4/00* | (2006.01) | |
| *G02B 1/10* | (2015.01) | |
| *G02F 1/1335* | (2006.01) | |
| *H10K 50/854* | (2023.01) | |
| *H10K 59/122* | (2023.01) | |
| *H10K 50/11* | (2023.01) | |
| *G02B 5/20* | (2006.01) | |
| *H10K 50/115* | (2023.01) | |
| *B82Y 20/00* | (2011.01) | |
| *H10K 102/00* | (2023.01) | |
| *H10K 59/38* | (2023.01) | |

(52) U.S. Cl.
CPC ............... *C09D 7/61* (2018.01); *G02B 1/10* (2013.01); *G02B 5/206* (2013.01); *G02F 1/133514* (2013.01); *H10K 50/11* (2023.02); *H10K 50/115* (2023.02); *H10K 50/854* (2023.02); *H10K 59/122* (2023.02); *B82Y 20/00* (2013.01); *G02F 2202/022* (2013.01); *G02F 2202/36* (2013.01); *G02F 2203/03* (2013.01); *H10K 59/38* (2023.02); *H10K 2102/331* (2023.02)

(56) References Cited

U.S. PATENT DOCUMENTS

| | | | |
|---|---|---|---|
| 2014/0319502 A1 | 10/2014 | Umemoto | |
| 2018/0156951 A1* | 6/2018 | Baek | G02F 1/133514 |
| 2018/0157083 A1* | 6/2018 | Yeo | G02F 1/133514 |
| 2019/0137815 A1* | 5/2019 | Kim | G02F 1/133512 |
| 2019/0227431 A1 | 7/2019 | Park et al. | |
| 2020/0312916 A1 | 10/2020 | Kim et al. | |

FOREIGN PATENT DOCUMENTS

| | | |
|---|---|---|
| KR | 10-1747268 B1 | 6/2017 |
| KR | 10-2018-0018945 A | 2/2018 |

OTHER PUBLICATIONS

Lin, Huang-Yu, et al., "Optical cross-talk reduction in a quantum-dot-based full-color micro-light-emitting-diode display by a lithographic-fabricated photoresist mold," Photonics Research, vol. 5, No. 5, Oct. 2017, 6 pages.

Zhou, Qingchao et al., "In Situ Fabrication of Halide Perovskite Nanocrystal-Embedded Polymer Composite Films with Enhanced Photoluminescence for Display Backlights," Advanced Materials, 2016, vol. 28, Wiley-VCH Verlag GmbH & Co., pp. 9163-9168.

Extended European Search Report issued in Application No. 21177874.1-1211 dated Nov. 12, 2021, 15 pages.

\* cited by examiner

DISPLAY DEVICE AND MANUFACTURING METHOD FOR THE SAME

CROSS-REFERENCE TO RELATED APPLICATION

This application claims priority to and the benefit of Korean Patent Application No. 10-2020-0069437, filed on Jun. 9, 2020 in the Korean Intellectual Property Office (KIPO), the entire content of which is hereby incorporated by reference.

BACKGROUND

1. Field

One or more embodiments of the present disclosure relate to a display device and a manufacturing method for the same, and more particularly, to a display device including a coating layer and a manufacturing method for the same.

2. Description of the Related Art

Various electronic devices are being developed to provide image information in multimedia devices including a television, a cellular phone, a tablet computer, a navigation, a game console, etc. Particularly, in an electronic device that includes a liquid crystal display device, an organic electroluminescence device, etc., a quantum dot, etc. may be employed to improve display quality.

In addition, methods for improving the emission efficiency of such electronic devices are studied.

SUMMARY

Aspects of one or more embodiments of the present disclosure are directed toward a display device including a coating layer and having improved emission efficiency.

In addition, aspects of one or more embodiments of the present disclosure also directed toward a method for manufacturing a display device having improved emission efficiency by including an act of forming a coating layer covering the side of a partition wall part.

In an embodiment, there is provided a display device including a light-emitting element layer; and a light control layer on the light-emitting element layer, wherein the light control layer includes a plurality of separated partition wall parts including a partition wall part; a color control part between the partition wall parts, the color control part including quantum dots and a first scattering particle; and a coating layer covering a side of the partition wall part adjacent to the color control part, the coating layer includes at least one selected from a substitution dispersant and a substitution scattering particle, the substitution dispersant including at least one substituent selected from an amine group and a carboxyl group, the substitution scattering particle including at least one substituent selected from an amine group and a carboxyl group, and the amine groups and the carboxyl groups included in the coating layer are different in number from each other.

In an embodiment, the coating layer may include the substitution dispersant and not include the substitution scattering particles, and the coating layer may include a second scattering particle that is different in substituent from the substitution scattering particles.

In an embodiment, the second scattering particle may include at least one selected from $TiO_2$, Ag, and Al.

In an embodiment, the substitution dispersant may include a polymer resin substituted with at least one selected from the amine group and the carboxyl group.

In an embodiment, the polymer resin may be at least one selected from polyurethane, polyethylene, polyacrylic, polyepoxy, and polyester resin.

In an embodiment, the coating layer may not include the substitution dispersant but include the substitution scattering particles.

In an embodiment, a surface of the first scattering particle may be substituted with a ligand including at least one selected from an amine group and a carboxyl group, and the amine groups at the surface of the first scattering particle and the carboxyl groups at the surface of the first scattering particle may be different in number from each other.

In an embodiment, the first scattering particle and the substitution scattering particle may be the same.

In an embodiment, the coating layer may further include a monomer, and the monomer may be a urethane monomer, an ethylene monomer, an acrylic monomer, an epoxy monomer, or an ester monomer.

In an embodiment, the coating layer may contact the color control part.

In an embodiment, the partition wall part of the partition wall parts may be separated from the color control part by the coating layer being between the partition wall part and the color control part.

In an embodiment of the present disclosure, there is provided a method for manufacturing a display device, including forming a color filter layer; and forming a light control layer, wherein the forming of the light control layer includes forming a plurality of partition wall parts including a partition wall part; providing a preliminary coating layer between the partition wall parts, the preliminary coating layer including at least one selected from a substitution dispersant and substitution scattering particles, the substitution dispersant including at least one substituent selected from an amine group and a carboxyl group, the substitution scattering particles including at least one substituent selected from an amine group and a carboxyl group; forming a coating layer covering a side of the partition wall part by providing vacuum and heat to the preliminary coating layer; and forming a color control part including quantum dots and first scattering particles between the partition wall parts on which the coating layer is formed, and wherein the amine groups and the carboxyl groups included in the preliminary coating layer are different in number from each other.

In an embodiment, the preliminary coating layer may further include a solvent, and the solvent may be removed with the forming of the coating layer.

In an embodiment, the solvent may include at least one selected from PGMEA, DMA, GBL, CHA, and DPMA.

In an embodiment, a boiling point of the solvent may be from about 50° C. to about 250° C.

In an embodiment, the preliminary coating layer may include the substitution dispersant and not include the substitution scattering particles, and the preliminary coating layer may include second scattering particles that are different in substituent from the substitution scattering particles.

In an embodiment, the second scattering particles may be greater than about 0 wt % to less than about 5 wt % based on a total weight of the preliminary coating layer.

In an embodiment, the preliminary coating layer may not include the substitution dispersant but include the substitution scattering particles.

In an embodiment, the preliminary coating layer may further include a monomer, and the monomer may be applied together with a thermal curing agent, or a photocuring agent.

In an embodiment, the monomer may be greater than about 0 wt % to less than about 5 wt % based on a total weight of the preliminary coating layer.

BRIEF DESCRIPTION OF THE FIGURES

The accompanying drawings are included to provide a further understanding of the present disclosure and are incorporated in and constitute a part of this specification. The drawings illustrate exemplary embodiments of the present disclosure and, together with the description, serve to explain principles of the present disclosure. In the drawings.

DETAILED DESCRIPTION

Figure 1:
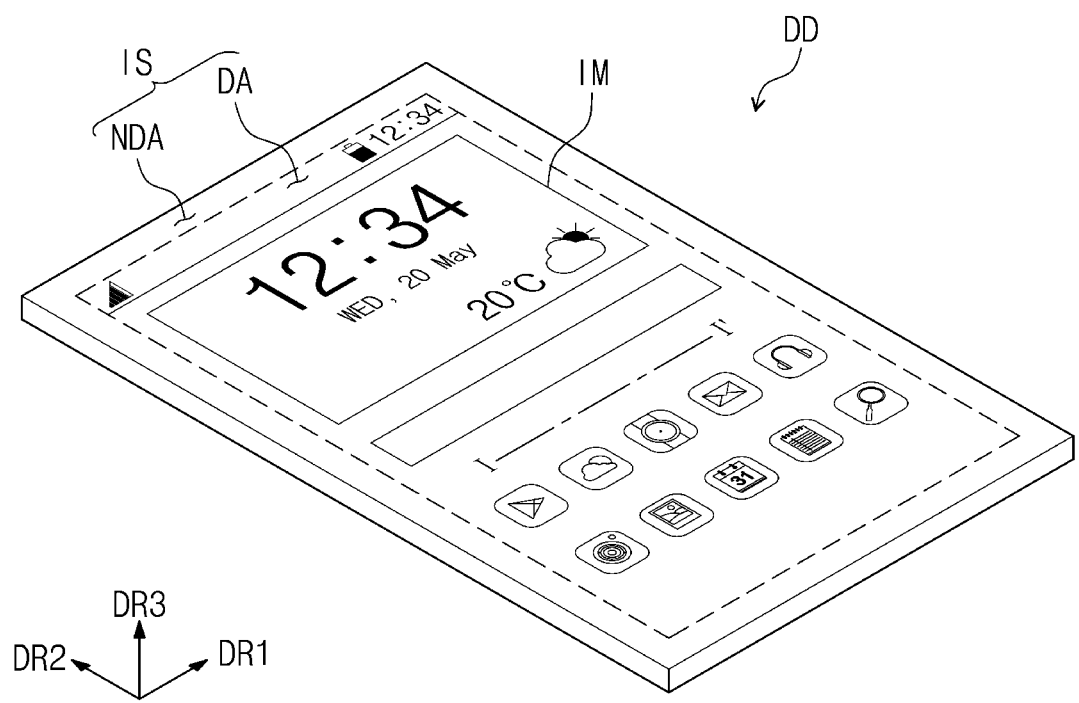
FIG. 1 is a perspective view showing a display device of an embodiment.

The present disclosure may have various modifications and may be embodied in different forms, and example embodiments will be explained in detail with reference to the accompany drawings. The present disclosure may, however, be embodied in different forms and should not be construed as limited to the embodiments set forth herein. Rather, all modifications, equivalents, and substituents which are included in the spirit and technical scope of the present disclosure should be included in the present disclosure.

It will be understood that when an element (or region, layer, part, etc.) is referred to as being "on", "connected to" or "coupled to" another element, it can be directly on, connected or coupled to the other element or one or more intervening elements may be present. When an element is referred to as being "directly on," "directly connected to," or "directly coupled to" another element, there are no intervening elements present.

Like reference numerals refer to like elements throughout. In addition, in the drawings, the thickness, the ratio, and the dimensions of constituent elements are exaggerated for effective explanation of technical contents.

As used herein, the singular forms "a," "an," and "the" are intended to include the plural forms as well, unless the context clearly indicates otherwise.

As used herein, expressions such as "at least one of," "one of," and "selected from," when preceding a list of elements, modify the entire list of elements and do not modify the individual elements of the list.

The term "and/or" includes one or more combinations which may be defined by relevant elements.

Further, the use of "may" when describing embodiments of the present disclosure refers to "one or more embodiments of the present disclosure".

As used herein, the terms "substantially," "about," and similar terms are used as terms of approximation and not as terms of degree, and are intended to account for the inherent deviations in measured or calculated values that would be recognized by those of ordinary skill in the art.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

It will be understood that, although the terms first, second, etc. may be used herein to describe various elements, these elements should not be limited by these terms. These terms are only used to distinguish one element from another element. Thus, a first element could be termed a second element without departing from the teachings of the present disclosure. Similarly, a second element could be termed a first element. As used herein, the singular forms are intended to include the plural forms as well, unless the context clearly indicates otherwise.

Spatially relative terms, such as "beneath," "below," "lower," "above," "upper," "bottom," "top," and the like, may be used herein for ease of description to describe one element or feature's relationship to another element(s) or feature(s) as illustrated in the drawings. It will be understood that the spatially relative terms are intended to encompass different orientations of the device in use or operation in addition to the orientation depicted in the drawings. For example, if the device in the drawings is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

Unless otherwise defined, all terms (including technical and scientific terms) used herein have the same meaning as commonly understood by one of ordinary skill in the art to which this disclosure is a part. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms "comprises" and/or "comprising," when used in this specification, specify the presence of stated features, numerals, steps, operations, elements, parts, or the combination thereof, but do not preclude the presence or addition of one or more other features, numerals, steps, operations, elements, parts, or the combination thereof.

Hereinafter, a display device and a method for manufacturing the display device according to an embodiment of the present disclosure will be explained with reference to attached drawings.

Figure 2:
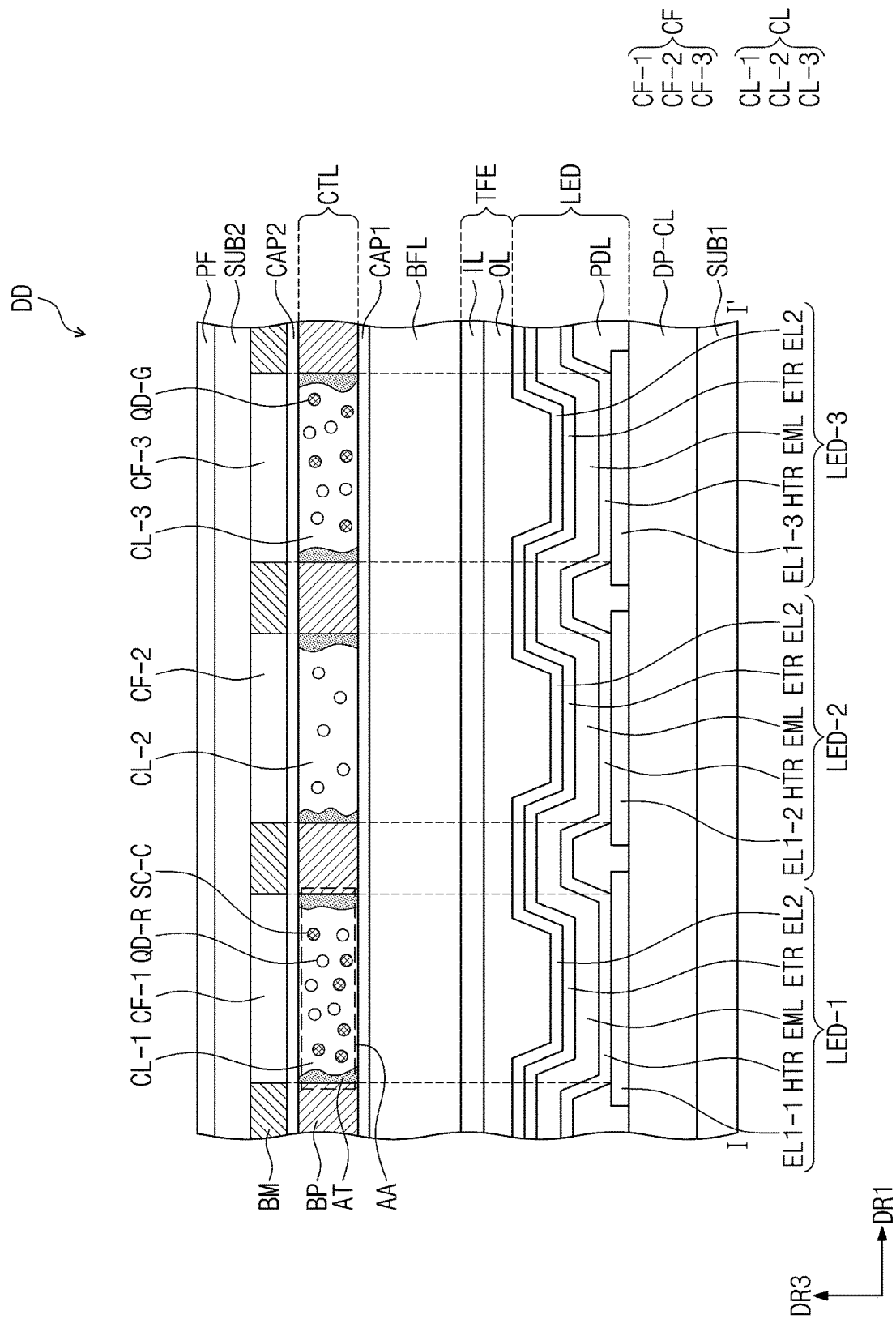
FIG. 2 is a cross-sectional view showing a part corresponding to line I-I' in FIG. 1.
Figure 3:
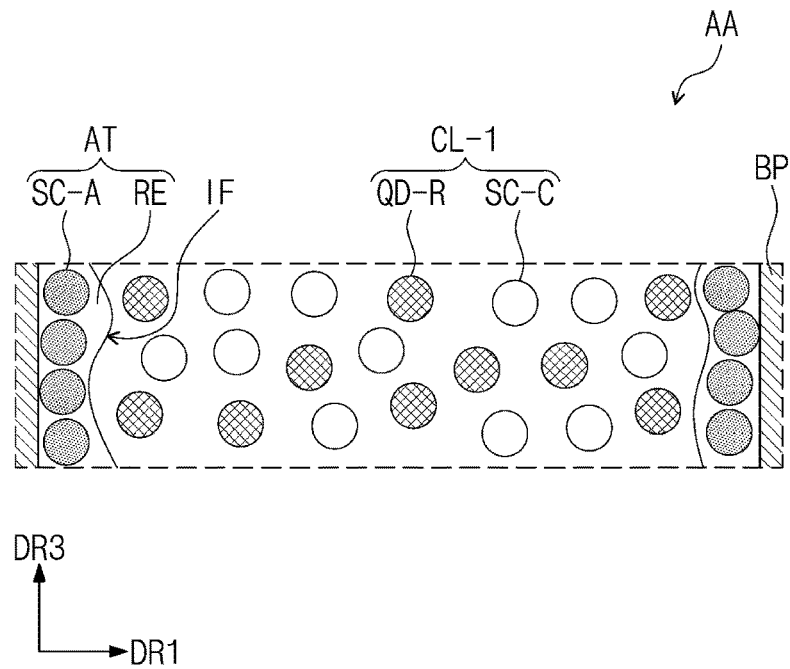
FIG. 3 is a cross-sectional view showing a part corresponding to region AA in FIG. 2.
Figure 4:
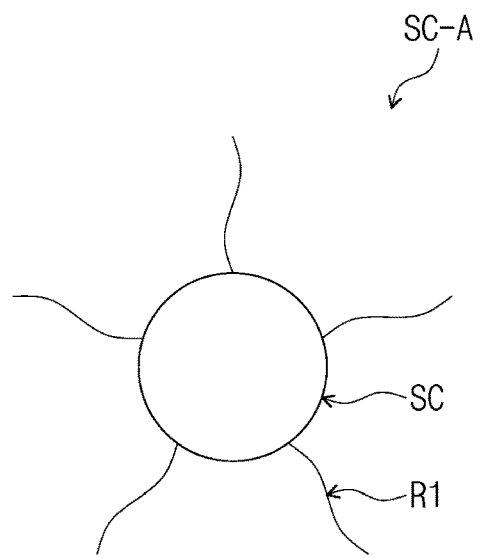
FIG. 4 is a cross-sectional view showing a substitution scattering particle of an embodiment.
Figure 5:
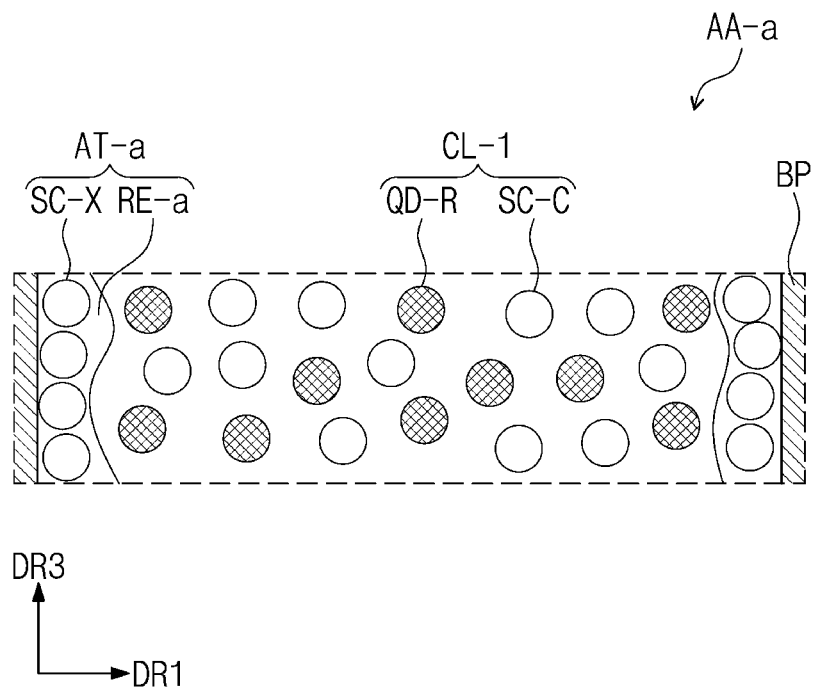
FIG. 5 is a cross-sectional view showing a part of a display device according to an embodiment.
Figure 6:
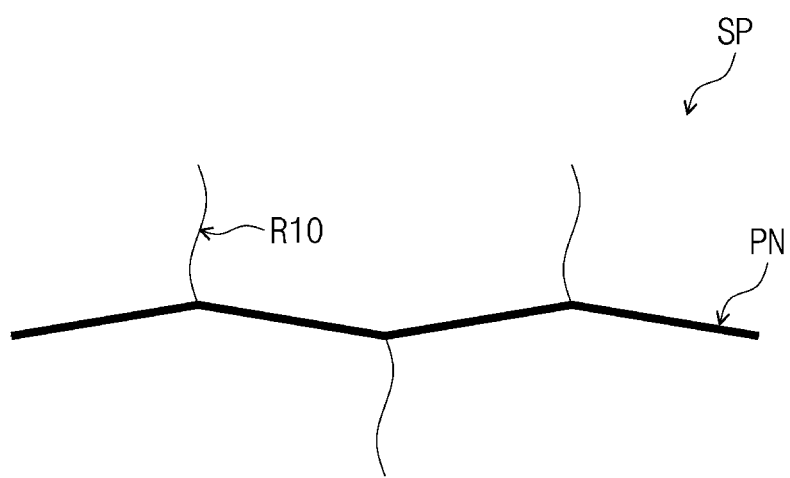
FIG. 6 is a diagram schematically showing a substitution dispersant of an embodiment.

FIG. 1 shows a display device according to an embodiment. FIG. 2 shows a part corresponding to line I-I' in FIG. 1, and is a cross-sectional view of a display device according to an embodiment. FIG. 3 is a cross-sectional view showing an enlarged region AA in FIG. 2, and FIG. 5 shows another embodiment of a coating layer of the present disclosure. FIG. 4 shows a substitution scattering particle of an embodiment. FIG. 6 shows a substitution dispersant of an embodiment.

In FIG. 1, a portable electronic device is illustrated as a display device DD.

The display device DD may be used in large-size electronic devices such as a television, a monitor and an external billboard as well as small and medium-size electronic devices such as a personal computer, a laptop computer, a personal digital terminal, a car navigation unit, a game console, a smart phone, a tablet and a camera. In addition, the aforementioned electronic devices are suggested as only embodiments, and the display device may be employed in other electronic devices unless the electronic devices deviate from the present disclosure.

Referring to FIG. 1, the display device DD may display images IM through a display surface IS. The display surface IS includes a display area DA displaying the images IM and a non-display area NDA which is adjacent to the display area DA. The non-display area NDA is an area not displaying images. In one or more embodiments, the non-display area NDA may surround or partially surround the display area DA The display area DA may have a tetragonal shape. However, the present disclosure is not limited thereto, and the shape of the display area DA and the shape of the non-display area NDA may be designed in a relative sense. Further, the shape of the display area DA and the shape of the non-display area NDA may be any suitable shape. Moreover, the non-display area NDA may not present on the forepart (or front surface) of the display device DD. For example, in one or more embodiments, the display area DA may be the only area on the forepart (or front surface) of the display device DD.

The display device DD of an embodiment may include a light-emitting element layer LED, and a light control layer CTL disposed on the light-emitting element layer LED. The light control layer CTL may include a plurality of separated partition wall parts BP, a color control part CL disposed between the partition wall parts BP, and a coating layer AT covering the sides (e.g., each of the right and left sides) of the partition wall parts BP. For example, in one or more embodiments, the coating layer AT may be between the color control part CL-1 and a right side of one of the partition wall parts BP. Coating layers AT and AT-a may include at least one among (e.g., at least one selected from) a substitution dispersant SP including at least one substituent among (e.g., at least one substituent selected from) an amine group and a carboxyl group, and substitution scattering particles SC-A including at least one substituent among (e.g., at least one substituent selected from) an amine group and a carboxyl group. According to an embodiment, the number of the amine groups and the number of the carboxyl groups included in the coating layers AT and AT-a may be different from each other. The light control layer CTL will be explained in more detail below.

Referring to FIG. 2, the display device DD may include a first substrate SUB1, a circuit layer DP-CL disposed on the first substrate SUB1, a light-emitting element layer LED disposed on the circuit layer DP-CL, and an encapsulation layer TFE disposed on the light-emitting element layer LED.

The first substrate SUB1 may be a polymer substrate, a plastic substrate, a glass substrate, and/or a quartz substrate. The first substrate SUB1 may be a transparent insulation substrate. In one or more embodiments, the first substrate SUB1 may be rigid, and in other embodiments, the first substrate SUB1 may be flexible. However, the present disclosure is not limited thereto. For example, portions of the first substrate SUB1 may be rigid and other portions of the first substrate SUB1 may be flexible.

The circuit layer DP-CL may be disposed on the first substrate SUB1, and the circuit layer DP-CL may include a plurality of transistors. Each of the transistors may include a control electrode, an input electrode, and an output electrode. For example, the circuit layer DP-CL may include a switching transistor and a driving transistor for driving light-emitting elements LED-1, LED-2 and LED-3.

The light-emitting element layer LED may include each of first to third light-emitting elements LED-1, LED-2 and LED-3. Each of the first to third light-emitting elements LED-1, LED-2 and LED-3 may include first electrodes EL1-1, EL1-2 and EL1-3, a hole transport region HTR, an emission layer EML, an electron transport region ETR and a second electrode EL2, stacked in order. For example, the first electrode EL1-1, EL1-2 or EL1-3, the hole transport region HTR, the emission layer EML, the electron transport region ETR and the second electrode EL2 may be sequentially stacked. The emission layer EML may generate blue light. The emission layer EML may generate light with a wavelength region (or having a wavelength) of about 410 nm to about 480 nm. The light-emitting element layer LED may emit blue light.

In the light-emitting element layer LED, a pixel defining layer PDL may be defined (e.g., defined between adjacent light-emitting elements LED-1, LED-2, and LED-3). The pixel defining layer PDL may be formed by including a polyacrylate-based resin or a polyimide-based resin. In one or more embodiments, the pixel defining layer PDL may be formed using an inorganic material. For example, the pixel defining layer PDL may be formed by including silicon nitride, silicon oxide, silicon oxynitride, etc. In the light-emitting element layer LED, the light-emitting elements LED-1, LED-2 and LED-3 may be divided or defined by or separated from each other by the pixel defining layer PDL.

The encapsulation layer TFE may be disposed on the light-emitting element layer LED and encapsulate the light-emitting element layer LED. The encapsulation layer TFE may play the role of protecting the light-emitting element layer LED from humidity and/or oxygen and protecting the light-emitting element layer LED from foreign materials such as dust particles. In FIG. 2, the encapsulation layer TFE is illustrated to include one organic layer OL and one inorganic layer IL, but the present disclosure is not limited thereto. For example, the encapsulation layer TFE may include at least one inorganic layer and at least one organic layer. In one or more embodiments, the encapsulation layer TFE may have an alternately stacked structure of organic layers and inorganic layers. For example, the encapsulation layer TFE may have a stacked structure of an inorganic layer, an organic layer, and an inorganic layer one by one.

The display device DD of an embodiment may include a light control layer CTL disposed on the light-emitting element layer LED. The light control layer CTL may include a plurality of separated partition wall parts BP, a color control part CL, and a coating layer AT.

The light control layer CTL of an embodiment may include a plurality of partition wall parts BP, a color control part CL disposed between the partition wall parts BP, and coating layers AT and AT-a covering the sides of the partition wall parts BP. The coating layers AT and AT-a may cover the sides of the partition wall parts adjacent to the color control part CL. In one or more embodiments, the coating layers AT and AT-a may be between the partition wall parts and the color control part CL. According to an embodiment, the coating layers AT and AT-a may include at least one among (e.g., at least one selected from) a substitution dispersant SP (e.g., see FIG. 6), and substitution scattering particles SC-A. The substitution dispersant SP may include at least one substituent among (e.g., at least one substituent selected from) an amine group and a carboxyl group. The substitution scattering particles SC-A may include at least one substituent among (e.g., at least one substituent selected from) an amine group and a carboxyl group. The number of the amine groups and the number of the carboxyl groups included in the coating layers AT and AT-a of an embodiment may be different from each other.

The partition wall parts BP may prevent or reduce a light leakage phenomenon and distinguish or be at boundaries between adjacent color control parts CL. The color control parts CL may include first to third color control parts (a first color control part CL-1, a second color control part CL-2 and a third color control part CL-3), which will be explained in more detail below, and the partition wall parts BP may distinguish or be at boundaries between the first to third color control parts CL-1, CL-2 and CL-3. The partition wall parts BP may include an organic material. The partition wall parts BP may include an organic blocking material including a black pigment or dye. The partition wall parts BP may include an organic material having hydrophobicity.

Referring to FIG. 2, partition wall parts BP may be separated or spaced from each other in or along a first direction extending in a direction of a first directional axis DR1. The top and bottom (e.g., top and bottom surfaces) of the partition wall parts BP may be parallel to the direction of the first directional axis DR1. The sides (e.g., side surfaces) of the partition wall parts BP may be parallel to a third direction extending in a direction of a third directional axis DR3. In the cross-sectional view of FIG. 2, sides (e.g., two opposite sides parallel to each other) of the partition wall parts BP are illustrated as a rectangular shape, but the shape of the partition wall parts BP is not limited thereto. For example, in a cross-sectional view representing a cross-section parallel to a plane defined by the first directional axis DR1 and the third directional axis DR3, the partition wall parts BP may have a trapezoidal shape including parallel short sides and long sides.

The partition wall parts BP may be separated from the color control part CL while putting the coating layers AT and AT-a in the middle. The coating layers AT and AT-a may be formed adjacent to each of the partition wall parts BP and the color control part CL. The coating layers AT and AT-a may make contact (e.g., direct contact) with the color control part CL. The coating layers AT and AT-a may make contact (e.g., direct contact) with the partition wall parts BP. The coating layers AT and AT-a may contact the sides of the partition wall parts BP. The coating layers AT and AT-a of an embodiment may cover the sides of the partition wall parts BP. The coating layers AT and AT-a may be formed by a method for manufacturing a display device of an embodiment, which will be explained in more detail below.

FIG. 3 and FIG. 5 show enlarged parts corresponding to region AA in FIG. 2. FIG. 3 shows a case where the coating layer AT includes the substitution scattering particles SC-A but does not include the substitution dispersant SP. In contrast, FIG. 5 shows a case where the coating layer AT-a does not include the substitution scattering particles SC-A but includes the substitution dispersant SP and second scattering particles SC-X. The residues RE and RE-a shown in FIG. 3 and FIG. 5 may include a monomer, etc., provided in the method for manufacturing a display device of an embodiment, which will be explained in more detail below. However, the present disclosure is not limited thereto, and the coating layer of an embodiment may not include the residue.

The coating layers AT and AT-a of an embodiment may include at least one among (e.g., at least one selected from) a substitution dispersant SP (e.g., see FIG. 6) including at least one substituent among (e.g., at least one substituent selected from) an amine group and a carboxyl group, and substitution scattering particles SC-A (e.g., see FIG. 4) including at least one substituent among (e.g., at least one substituent selected from) an amine group and a carboxyl group. The number of the amine groups and the number of the carboxyl groups included in the coating layers AT and AT-a of an embodiment may be different from each other. Accordingly, the coating layers AT and AT-a of an embodiment may more strongly show one type of properties among the properties of the amine group and the carboxyl group.

The coating layers AT and AT-a may include at least one among an amine group and a carboxyl group. For example, the coating layers AT and AT-a may include the amine group but not include the carboxyl group. The coating layers AT and AT-a may not include the amine group but include the carboxyl group. In contrast, the coating layers AT and AT-a may include both the amine group and the carboxyl group. In a case where the coating layers AT and AT-a include both the amine group and the carboxyl group, the number of the amine groups and the number of the carboxyl groups may be different from each other. The coating layers AT and AT-a may include both the amine group and the carboxyl group, and the number of the carboxyl groups may be greater than the number of the amine groups based on the total (all) of the coating layers AT and AT-a. The coating layers AT and AT-a may include both the amine group and the carboxyl group, and the number of the amine groups may be greater than the number of the carboxyl groups based on the total (all) of the coating layers AT and AT-a.

The coating layer AT of an embodiment may include the substitution scattering particles SC-A including at least one substituent among an amine group and a carboxyl group, but not include the substitution dispersant SP. Referring to FIG. 4, a substitution scattering particle SC-A may include at least one substituent R1 among an amine group and a carboxyl group. The substitution scattering particle SC-A may include at least one substituent R1 in a scattering particle SC. For example, the scattering particle SC may be at least one among $TiO_2$, Ag, and Al. However, these are illustrations, and the present disclosure is not limited thereto. In FIG. 4, the substitution scattering particle SC-A includes five substituents R1 at the surface of the scattering particle SC, but the number of the substituents substituted at the surface of the substitution scattering particle SC-A is not limited thereto.

The substituent R1 may be at least one among an amine group and a carboxyl group. A plurality of all the substituents R1 included in the substitution scattering particle SC-A may be the same. For example, the plurality of all the substituents R1 may be amine groups. As another example, the plurality of all the substituents R1 may be carboxyl groups. In a case where all the substituents R1 are amine groups or carboxyl groups, the substitution scattering particle SC-A may show the properties of an amine group or the properties of a carboxyl group.

For example, in one or more embodiments, all five substituents R1 may be amine groups. In other embodiments, all five substituents R1 may be carboxyl groups. In a case where all five substituents R1 included in the substitution scattering particle SC-A are amine groups, the substitution scattering particle SC-A may show the properties of an amine group. In a case where all five substituents R1 included in the substitution scattering particle SC-A are carboxyl groups, the substitution scattering particle SC-A may show the properties of a carboxyl group.

Meanwhile, in a case where three are amine groups, and two are carboxyl groups among five substituents R1 included in the substitution scattering particle SC-A, the substitution scattering particle SC-A may show both the properties of an amine group and the properties of a carboxyl group, but the properties of an amine group may be stronger than the properties of a carboxyl group. In addition, in a case where one is an amine group, and four are carboxyl groups among five substituents R1 included in the substitution scattering particle SC-A, the substitution scattering particle SC-A may show both the properties of an amine group and the properties of a carboxyl group, but the properties of a carboxyl group may be stronger than the properties of an amine group. However, these are only illustrations, and in the substitution scattering particle of an embodiment including a plurality of substituents, the number of the amine groups and the number of the carboxyl groups are not limited thereto.

The substitution scattering particle SC-A may show the properties of a relatively dominant substituent among the amine group and the carboxyl group in the substituent R1 included in the substitution scattering particle SC-A. In addition, in the substituent R1 included in the substitution scattering particle SC-A, a case where the number of the amine groups and the number of the carboxyl groups are the same, is excluded. More particularly, a case where the substitution scattering particle SC-A shows the properties of an amine group and the properties of a carboxyl group equally, is excluded.

The coating layer AT-a of an embodiment may not include the substitution scattering particles SC-A but include the substitution dispersant SP. The coating layer AT of an embodiment may include the substitution dispersant SP (e.g., see FIG. 6) including at least one substituent among an amine group and a carboxyl group, may not include the substitution scattering particles SC-A (e.g., see FIG. 4), but may include second scattering particles SC-X. In a case where the coating layer AT includes the substitution dispersant SP but does not include the substitution scattering particles SC-A, the second scattering particles SC-X may be included. The second scattering particle SC-X is a scattering particle in which a substituent such as an amine group and a carboxyl group is not substituted at the surface of the second scattering particle SC-X. For example, in one or more embodiments, the second scattering particle SC-X may be just a scattering particle SC without a substituent R1. The second scattering particle SC-X may be at least one among $TiO_2$, Ag, and Al. For example, the second scattering particle SC-X may be $TiO_2$.

Referring to FIG. 6, the substitution dispersant SP may be a polymer resin PN in which at least one substituent R10 among an amine group and a carboxyl group is substituted. The polymer resin PN may be at least one among polyurethane, polyethylene, polyacrylate, polyepoxy, and polyester. The substituent R10 combined with the polymer resin PN may be at least one among an amine group and a carboxyl group. FIG. 6 illustrates a polymer resin PN combined with three substituents R10, but the number of the substituents R10 combined with the polymer resin PN is not limited thereto.

For example, all three substituents R10 may be amine groups. In a case where all three substituents substituted at the polymer resin PN are amine groups, the substitution dispersant SP may show the properties of an amine group. In contrast, all three substituents R10 may be carboxyl groups. In a case where all three substituents substituted at the polymer resin PN are carboxyl groups, the substitution dispersant SP may show the properties of a carboxyl group. In one or more embodiments, in a case where two are amine groups, and one is a carboxyl group among the three substituents R10 included in the polymer resin PN, the substitution dispersant SP may show both the properties of an amine group and the properties of a carboxyl group, but may show the properties of an amine group more strongly. In a case where one is an amine group, and two are carboxyl groups among the three substituents R10 included in the polymer resin PN, the substitution dispersant SP may show both the properties of an amine group and the properties of a carboxyl group, but may show the properties of a carboxyl group more strongly. The polymer resin PN may show the properties of a relatively dominant substituent among the amine group and the carboxyl group in the substituent R10 included in the polymer resin PN. In addition, a case where the number of the amine groups and the number of the carboxyl groups are the same, is excluded from the substituent R10 included in the polymer resin PN. More particularly, a case where the properties of an amine group and the properties of a carboxyl group are equally shown, is excluded.

For example, the substitution dispersant SP may include any one among the following Compound 1 to Compound 3 (e.g., Compound 1, Compound 2, and/or Compound 3):

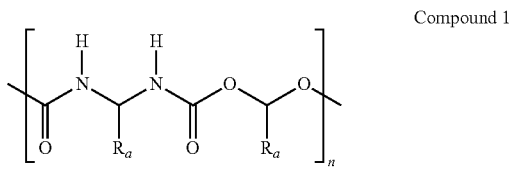

Compound 1

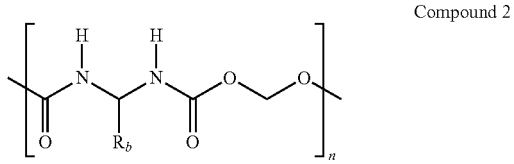

Compound 2

Compound 3

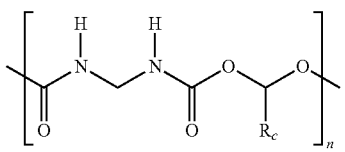

Each of Compounds 1-3 may include a urethane monomer. The substitution dispersant SP including Compound 1 may include polyurethane as a polymer resin and $R_a$ as a substituent. The substitution dispersant SP including Compound 2 may include polyurethane as a polymer resin and $R_b$ as a substituent. The substitution dispersant SP including Compound 3 may include polyurethane as a polymer resin and $R_c$ as a substituent.

In Compounds 1-3, $R_a$, $R_b$, and $R_c$ may each independently be at least one among an amine group and a carboxyl group. In Compound 1, each of a plurality of $R_a$ groups may be the same. In Compound 1 according to one or more embodiments, a plurality of $R_a$ groups may be the same as an amine group. In other embodiments, in Compound 1, a plurality of $R_a$ groups may be the same as a carboxyl group. In Compounds 1-3, n is an integer of 1 to 100.

The coating layers AT and AT-a of an embodiment may include at least one substituent among an amine group and a carboxyl group as a substituted type at the substitution dispersant SP or the substitution scattering particle SC-A. The substitution scattering particle SC-A may include the substituent R1 (e.g., see FIG. 4) at the surface of a scattering particle SC or the second scattering particle SC-X. The substitution dispersant SP may be a polymer resin PN substituted with at least one substituent R10 (e.g., see FIG. 6) among an amine group and a carboxyl group.

In addition, in the coating layers AT and AT-a of an embodiment, the number of amine groups and the number of carboxyl groups may be different. Accordingly, the coating layers AT and AT-a may show the properties of one type more strongly among the properties of an amine group and the properties of a carboxyl group. The coating layers AT and AT-a not showing the properties of an amine group and the properties of a carboxyl group equally may prevent or reduce the adsorption of the first scattering particles SC-C included in a color control part CL, which will be explained in more detail below, on the partition wall part.

Referring to FIG. 2 again, the color control part CL may include a first color control part CL-1, a second color control part CL-2, and a third color control part CL-3. In one or more embodiments, each of the first color control part CL-1, the second color control part CL-2, and the third color control part CL-3 may include the first scattering particles SC-C. The first scattering particle SC-C may be substituted with a ligand including at least one among an amine group and a carboxyl group at the surface thereof, and the number of the amine groups and the number of the carboxyl groups may be different. According to an embodiment, the first scattering particle SC-C may be the same as the substitution scattering particle SC-A. In other embodiments, the first scattering particle SC-C and the substitution scattering particle SC-A may be different. The first scattering particle SC-C may include the second scattering particle SC-X or the scattering particle SC in which at least one ligand among an amine group and a carboxyl group is substituted at the surface thereof. However, this is only an illustration, and the first scattering particle SC-C may be a scattering particle, which is different from the second scattering particle SC-X (e.g., with different scattering particles SCs), in which at least one among an amine group and a carboxyl group is substituted at the surface thereof.

In one or more embodiments, the first scattering particle SC-C may be substituted with only a ligand including an amine group or only a ligand including a carboxyl group. In other embodiments, the first scattering particle SC-C may be substituted with both a ligand including an amine group and a ligand including a carboxyl group. In a case where the surface of the first scattering particle SC-C is substituted with a ligand including an amine group and a ligand including a carboxyl group, the number of the ligands including an amine group and the number of the ligands including a carboxyl group may be different. That is, the number of ligands including an amine group may be greater than the number of ligands including a carboxyl group, or the number of ligands including a carboxyl group may be greater than the number of ligands including an amine group. If the number of ligands including an amine group is greater than the number of ligands including a carboxyl group, the first scattering particle SC-C may show the properties of an amine group more strongly than the properties of a carboxyl group. The first scattering particle SC-C may show any one type of properties more strongly among the properties of an amine group and the properties of a carboxyl group.

If the first scattering particle shows the properties of an amine group and carboxyl group equally, the formation of the color control part including the first scattering particles by an ink jet method may be unsuitable. If the color control part is formed by an ink jet method, the jetting properties of a material including the first scattering particles having the properties of an amine group and carboxyl group equally may be deteriorated. In addition, in a light control layer not including a coating layer, if the first scattering particle shows any one type of properties among the properties of an amine group and a carboxyl group more strongly, the first scattering particles of the color control part may be adsorbed onto the partition wall part. If the first scattering particles are adsorbed onto the partition wall part, the number of the first scattering particles positioned in the middle of the color control part may decrease which may deteriorate or reduce the scattering phenomenon of light, and the deterioration phenomenon of the emission efficiency of a display device may be shown (e.g., be visible) or occur. Each of the coating layers AT and AT-a, and the first scattering particle SC-C of an embodiment may show any one type of properties more strongly among the properties of an amine group and a carboxyl group, and the adsorption of the first scattering particles SC-C onto the partition wall part BP may be prevented or reduced. In addition, the color control part CL of an embodiment may be formed (e.g., easily formed) by an ink jet method.

Meanwhile, at least one among the first to third color control parts CL-1, CL-2 and CL-3 may include quantum dots QD-G and QD-R. The quantum dots QD-G and QD-R may transform the wavelength of light emitted from a light-emitting element layer LED. The first color control part CL-1 may include a red quantum dot QD-R and transform blue light into red light. The second color control part CL-2 may transmit blue light. The second color control part CL-2 may be formed using a transparent resin but may further include a blue pigment or dye. The third color control part CL-3 may include a green quantum dot QD-G and transform blue light into green light.

The quantum dots QD-G and QD-R are materials having a crystal structure with a size of several nanometers, composed of hundreds to thousands of atoms, and shows quantum confinement effects by which an energy band gap increases due to a small size. If light with a wavelength having higher energy than the band gap is incident to the quantum dots QD-G and QD-R, the quantum dots QD-G and QD-R absorb the light to be at an excited state (e.g., become excited from a ground state to an excited state) and emit light with a specific wavelength (e.g., a wavelength based on the band gap) while falling to the ground state. The emitted light has a wavelength with a value corresponding to the band gap. If the size and composition of the quantum dots QD-G and QD-R are controlled, emission properties by the quantum confinement may be controlled. The quantum dots QD-G and QD-R may be selected from group II-VI compounds, group III-V compounds, group IV-VI compounds, group IV elements, group IV compounds, group I-III-VI compounds, and combinations thereof. In a case where the quantum dots QD-G and QD-R are binary compounds, ternary compounds or quaternary compounds, the quantum dots QD-G and QD-R may be present in uniform or substantially uniform concentration or in a state with partially different concentration distributions in the same particle. In addition, the quantum dots QD-G and QD-R may have a core/shell structure in which one quantum dot surrounds another quantum dot. The interface of the core and shell may have a concentration gradient with decreasing concentration of elements present in the shell towards the center (e.g., towards the core).

Referring to FIG. 2, on the encapsulation layer TFE, a buffer layer BFL, a first capping layer CAP1, a light control layer CTL, and a second capping layer CAP2 may be stacked in order (e.g., sequentially stacked). In addition, on the second capping layer CAP2, a color filter layer CF, a second substrate SUB2, and a protection film PF may be stacked in order (e.g., sequentially stacked).

The buffer layer BFL may be disposed between the encapsulation layer TFE and the light control layer CTL. The buffer layer BFL may prevent or substantially prevent the direct contact of the encapsulation layer TFE and the light control layer CTL.

On the upper side and lower side of the light control layer CTL, the first capping layer CAP1 and the second capping layer CAP2 may be further disposed. Each of the first capping layer CAP1 and the second capping layer CAP2 may contact the light control layer CTL. The first capping layer CAP1 and the second capping layer CAP2 may cover the bottom side and the top side of the light control layer CTL, respectively.

The color filter layer CF may include first to third color filter parts (a first color filter part CF-1, a second color filter part CF-2 and a third color filter part CF-3). The first to third filter parts CF-1, CF-2 and CF-3 may be separately disposed in an extended direction of a first directional axis DR1. Between the color filter parts CF-1, CF-2 and CF-3, a light blocking part BM may be disposed.

The first to third color filter parts CF-1, CF-2 and CF-3 may be disposed corresponding to the first to third color control parts CL-1, CL-2 and CL-3 included in the color control layer CTL. The first color filter part CF-1 may be disposed corresponding to the first color control part CL-1 and may transmit first light. The second color filter part CF-2 may be disposed corresponding to the second color control part CL-2 and transmit second light which is different from the first light. The third color filter part CF-3 may be disposed corresponding to the third color control part CL-3 and transmit third light which is different from the first light and second light. The first color filter part CF-1 may transmit light in a wavelength region of about 625 nm to about 675 nm. The second color filter part CF-2 may transmit light in a wavelength region of about 410 nm to about 480 nm. The third color filter part CF-3 may transmit light in a wavelength region of about 500 nm to about 570 nm. For example, the first light may be red light, the second light may be blue light, and the third light may be green light. The first color filter part CF-1 may transmit red light while blocking blue light and green light. The second color filter part CF-2 may transmit blue light while blocking green light and red light. The third color filter part CF-3 may transmit green light while blocking blue light and red light. Although specific wavelength regions are described for transmission by the first to third color filter parts CF-1, CF-2 and CF-3, the present disclosure is not limited thereto. For example, the first to third color filter parts CF-1, CF-2 and CF-3 may be modified to transmit any suitable wavelength region.

The light blocking part BM may be formed by including an organic light blocking material including a black pigment or dye or an inorganic light blocking material. In one or more embodiments, the light blocking part BM may be formed by including an organic light blocking material including a blue pigment or dye or an inorganic light blocking material.

The second substrate SUB2 may be a polymer substrate, a plastic substrate, a glass substrate, and/or a quartz substrate. The second substrate SUB2 may be a transparent insulation substrate. The second substrate SUB2 may be rigid, and in other embodiments, the second substrate SUB2 may be flexible. However, the present disclosure is not limited thereto. For example, portions of the second substrate SUB2 may be rigid and other portions of the second substrate SUB2 may be flexible.

On the second substrate SUB2, a protection film PF may be disposed. The protection film PF may protect the display surface IS of the display device DD and relieve reflection phenomenon due to a refractive index difference between the second substrate SUB2 and the air. In the display device of an embodiment, the protection film PF may be omitted, and another member for protecting the display surface IS may be disposed.

Referring to FIG. 3, the interface IF of the coating layer AT adjacent to the first color control part CL-1 is not shown as a straight line but a curved line in a cross-sectional view. However, this is an illustration, and the shape of the interface IF is not limited thereto (e.g., not limited to a curved line). According to the behavior of the substitution dispersant SP, or the second scattering particles SC-X included in the coating layer AT, the shape of the interface IF may be changed.

The coating layers AT and AT-a of an embodiment may include at least one substituent among an amine group and a carboxyl group in a substituted state to the substitution dispersant SP or substitution scattering particles SC-A. In a case where the coating layer AT-a includes the substitution dispersant SP, the second scattering particles SC-X may be included. By the substitution scattering particles SC-A or the second scattering particles SC-X included in the coating layers AT and AT-a, the side of the partition wall part BP may be covered. The substitution scattering particles SC-A and the second scattering particles SC-X may prevent or reduce the adsorption of the first scattering particles SC-C included in the color control part CL onto the side of the partition wall part BP.

In the light control layer not including a coating layer, the amount adsorbed of the first scattering particles included in the color control part onto the partition wall part may increase compared to a light control layer including a coating layer. Based on the adsorption of the first scattering particles onto the partition wall part, the number of the first scattering particles distributed in the middle of the color control part may decrease, and accordingly, the scattering phenomenon of light at the color control part may be reduced or deteriorated, and the degrading phenomenon of the emission efficiency of a display device may be generated or occur.

According to an embodiment, the number of amine groups and the number of carboxyl groups included in the coating layers AT and AT-a may be different, and the coating layers AT and AT-a may show any type of properties more strongly among the properties of an amine group and the properties of a carboxyl group. The display device DD of an embodiment may include the coating layers AT and AT-a covering the side of the partition wall part BP, and the substitution scattering particles SC-A or the second scattering particles SC-X included in the coating layers AT and AT-a may cover the side of the partition wall part. Accordingly, the adsorption of the first scattering particles SC-C included in the color control part CL onto the partition wall part BP may be prevented or reduced. The deterioration of the emission efficiency of the display device by the adsorption of the first scattering particles SC-C onto the partition wall part BP may be prevented or reduced. In addition, the display device of an embodiment may include the substitution scattering particles SC-A or the second scattering particles SC-X in the coating layers AT and AT-a which may enlarge the scattering region of light, and provide improved emission efficiency of the display device.

Figure 7:
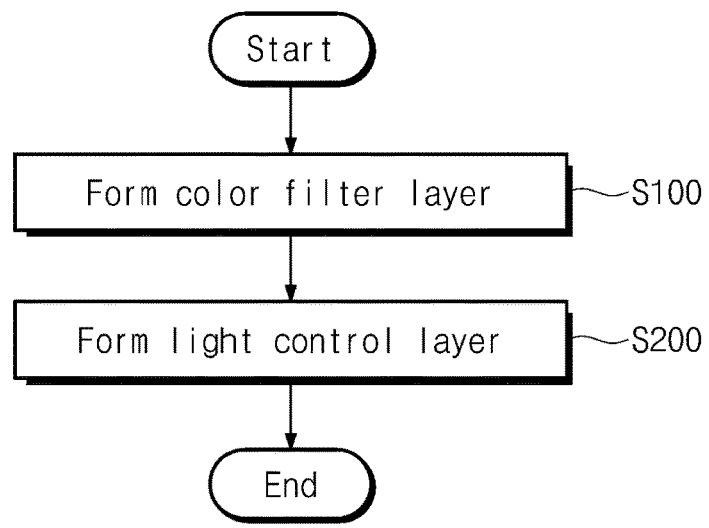
FIG. 7 is a flowchart showing a method for manufacturing a display device of an embodiment.
Figure 8:
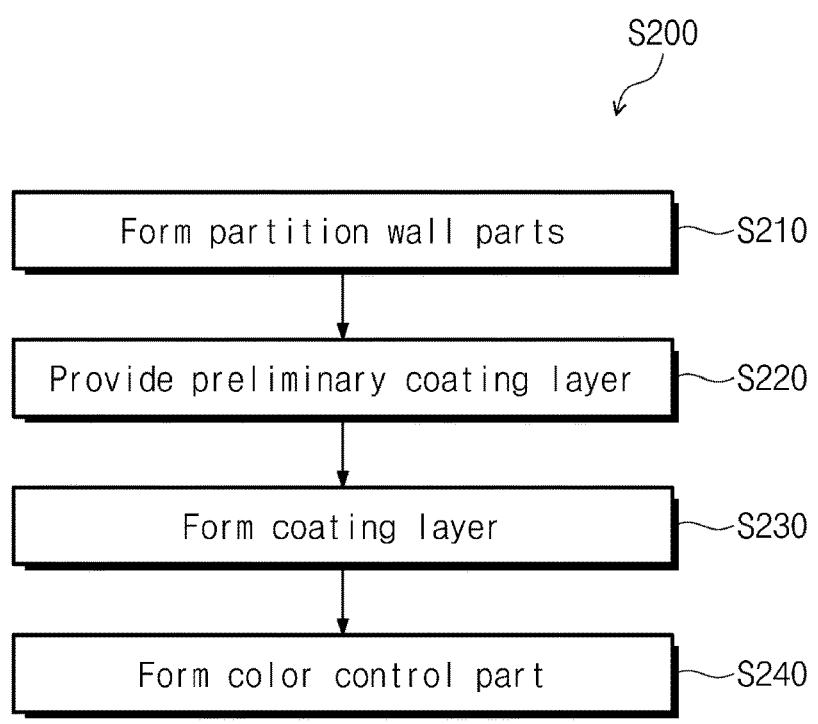
FIG. 8 is a flowchart showing a method for manufacturing a display device of an embodiment.
Figure 9:
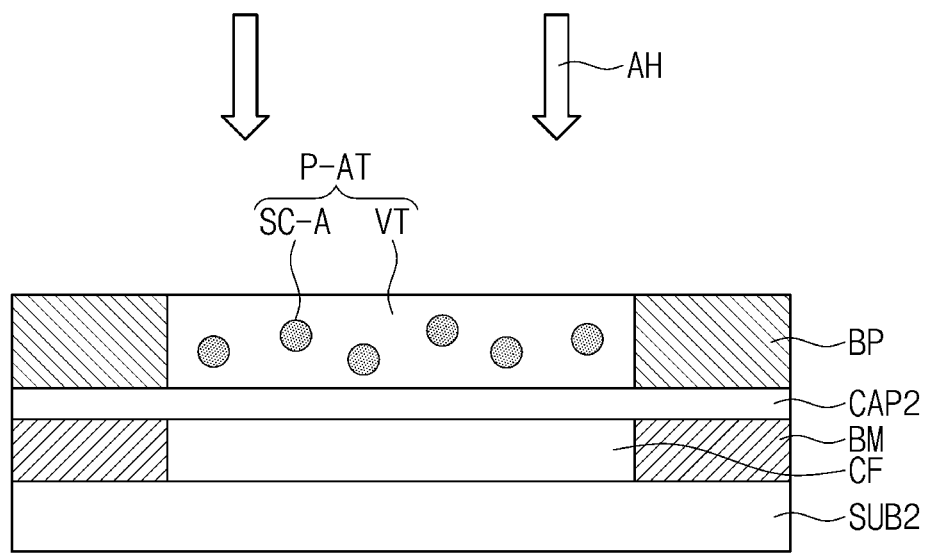
FIG. 9 is a cross-sectional view showing an act of a method for manufacturing a display device of an embodiment.
Figure 10:
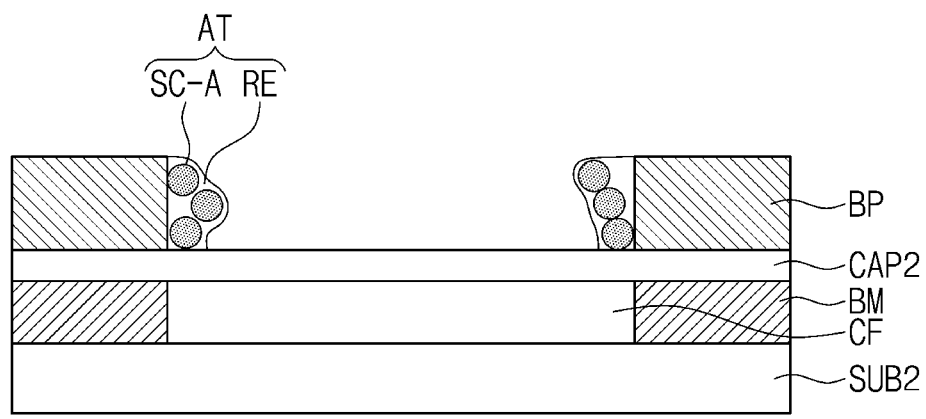
FIG. 10 is a cross-sectional view showing an act of a method for manufacturing a display device of an embodiment.
Figure 11:
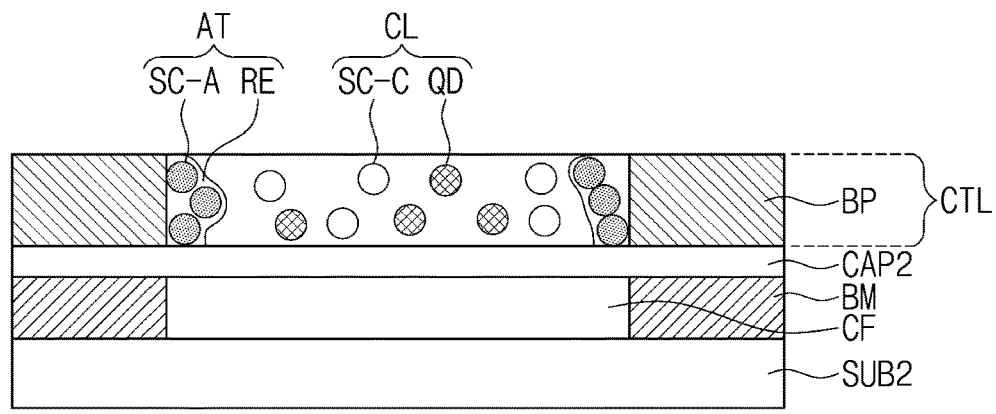
FIG. 11 is a cross-sectional view showing an act of a method for manufacturing a display device of an embodiment.

FIG. 7 and FIG. 8 are flowcharts schematically showing a method for manufacturing a display device of an embodiment. FIGS. 9-11 are diagrams schematically showing the acts of a method for manufacturing a display device of an embodiment. Hereinafter, in the explanation on the method for manufacturing a display device of an embodiment, the same contents as the explained contents referring to FIGS. 2-6 will not be repeated, and different points may be explained. The same reference symbols will be designated to the elements explained referring to FIGS. 2-6, and therefore, a description of the repeated reference symbols may not be repeated.

The method for manufacturing a display device of an embodiment may include an act of forming a color filter layer CF (S100), and an act of forming a light control layer CTL (S200). The step of forming a light control layer CTL (S200) may include an act of forming a plurality of partition wall parts BP (S210), an act of providing a preliminary coating layer P-AT between the partition wall parts BP (S220), an act of applying vacuum and heat AH to the preliminary coating layer P-AT to form a coating layer AT (S230), and an act of forming a color control part CL including quantum dots QD and first scattering particles SC-C between the partition wall parts BP on which the coating layer AT is formed (S240).

Referring to FIG. 9, the color filter layer CF may be formed on the second substrate SUB2 (e.g., see FIG. 2). The color filter layer CF may be formed on the second substrate SUB2. On the color filter layer CF, a light control layer CTL (e.g., see FIG. 2) may be formed. However, the present disclosure is not limited thereto, and the color filter layer CF may be formed not on the second substrate SUB2 but on a separate member.

In FIG. 9, the act of forming a coating layer (S230) is shown. Vacuum and heat AH may be applied to the preliminary coating layer P-AT to form a coating layer AT. The vacuum and heat applied to the preliminary coating layer P-AT may be applied concurrently (e.g., at the same time). In other embodiments, vacuum and heat applied to the preliminary coating layer P-AT may be applied one by one (i.e., sequentially). Vacuum may be applied first to the preliminary coating layer P-AT, and after a lapse of a certain time, heat may be applied.

According to an embodiment, the preliminary coating layer P-AT may include at least one among substitution scattering particles SC-A (e.g., see FIG. 4) and a substitution dispersant SP (e.g., see FIG. 6). Each of the substitution scattering particles SC-A and the substitution dispersant SP may include at least one substituent among an amine group and a carboxyl group. In FIG. 9, the preliminary coating layer P-AT includes the substitution scattering particles SC-A and is provided on the color filter layer CF. For example, the preliminary coating layer P-AT may be provided on the color filter layer CF with the second capping layer CAP2 provided between the color filter layer CF and the preliminary coating layer P-AT as shown in FIG. 9. However, the present disclosure is not limited thereto. For example, the preliminary coating layer P-AT may include the substitution dispersant SP and be provided on the color filter layer CF. In a case where the preliminary coating layer P-AT includes the substitution dispersant SP, the preliminary coating layer P-AT may include second scattering particles SC-X. The preliminary coating layer P-AT may include the second scattering particles SC-X in greater than about 0 wt % to less than about 5 wt % based on the total weight of the preliminary coating layer P-AT.

The preliminary coating layer P-AT may further include a monomer. Based on the total weight of the preliminary coating layer P-AT, the monomer may be included in greater than about 0 wt % to less than about 5 wt %. The monomer may be provided together with a thermal curing agent or a photocuring agent. After the substitution scattering particles SC-A are adsorbed onto the partition wall part to form the coating layer AT, the monomer may prevent or reduce the separation of the substitution scattering particles SC-A from the coating layer AT. If heat AH is applied to the preliminary coating layer P-AT, the substitution scattering particles SC-A may be separated from the partition wall part. The monomer may be applied to prevent or to reduce the separation of the substitution scattering particles SC-A from the partition wall part. For example, the monomer may be a urethane monomer, an ethylene monomer, an acrylic monomer, an epoxy monomer, or an ester monomer.

The preliminary coating layer P-AT may further include a solvent VT. The solvent VT may be removed according to the application of vacuum and heat AH. The solvent VT may include at least one among (e.g., at least one selected from) propylene glycol methyl ether acetate (PGMEA), dimethylacetamide (DMA), gamma-butyrolactone (GBL), cyclohexyl acetate (CHA) and dipropylene glycol monomethyl ether acetate (DPMA). The boiling point of the solvent VT may be about 50° C. to about 250° C. For example, the boiling point of the solvent VT may be about 100° C. to about 200° C. The vapor pressure of the solvent VT may be greater than about 0.1 mmHg to less than about 1 mmHg. However, these are only illustrations, and the present disclosure is not limited thereto.

After removing the solvent VT from the preliminary coating layer P-AT, the substitution scattering particles SC-A may be adsorbed onto the side of the partition wall part BP, and residues RE such as the monomer may remain. The residue RE may be materials excluding the substitution scattering particles SC-A. Meanwhile, all the residues RE may be removed from the coating layer AT of an embodiment, and the coating layer AT may be formed only with the substitution scattering particles SC-A.

The substitution scattering particles SC-A adsorbed onto the side of the partition wall part BP may prevent or reduce the adsorption of the first scattering particles SC-C included in the color control part CL onto the partition wall part BP. If the preliminary coating layer includes the substitution dispersant SP and the second scattering particles SC-X (e.g., see FIG. 5), the second scattering particles SC-X may be adsorbed onto the side of the partition wall part. The second scattering particles SC-X may prevent or reduce the adsorption of the first scattering particles SC-C included in the color control part CL onto the partition wall part BP. In addition, the substitution scattering particles SC-A and the second scattering particles SC-X may contribute to the scattering of light provided from the light-emitting element layer LED. Accordingly, the emission efficiency of the display device may be improved.

After forming the coating layer AT from the preliminary coating layer P-AT, the color control part CL may be formed. The color control part CL shown in FIG. 11 may be the aforementioned first color control part CL-1 (e.g., see FIG. 2) or the third color control part CL-3 (e.g., see FIG. 2). The quantum dot QD shown in the color control part CL may be the aforementioned red quantum dot QD-R or green quantum dot QD-G. In addition, the color control part CL may be the aforementioned second color control part CL-2 (e.g., see FIG. 2), and in a case where the color control part CL of FIG. 11 is the second color control part CL-2, the quantum dot QD may not be included.

The method for manufacturing a display device of an embodiment includes the act of forming a light control layer CTL (S200), and the forming of the light control layer CTL may include the act of forming a coating layer AT (S230). By providing the preliminary coating layer P-AT including the substitution scattering particles SC-A, or the substitution dispersant SP and the second scattering particles SC-X, the coating layer AT may be formed. The substitution scattering particles SC-A and the second scattering particles SC-X may cover the side of the partition wall part BP, and a display device DD having improved emission efficiency may be provided.

Figure 12:
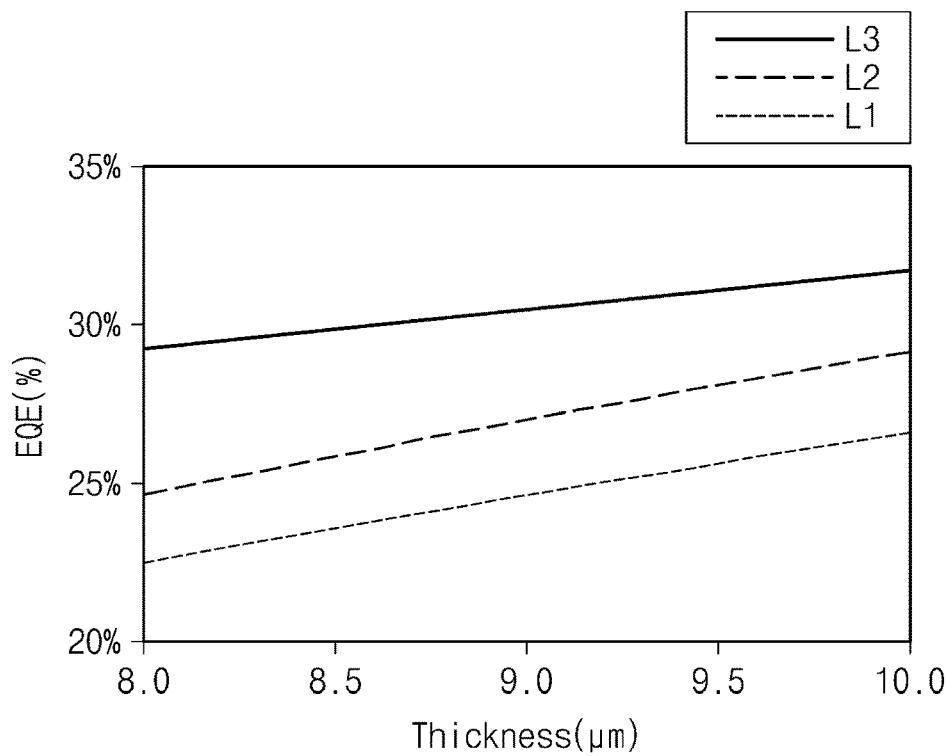
FIG. 12 is a graph showing emission efficiency in accordance with the number of scattering particles.

The graph of FIG. 12 shows emission efficiency in accordance with the number of scattering particles. In the light control layers of "L1", "L2" and "L3", the number of the first scattering particles not adsorbed onto the partition wall part but distributed in the middle of the color control part are different. "L2" represents a case where the number of the first scattering particles distributed in the middle of the color control part is twice the number of the first scattering particles distributed in the middle of the color control part of "L1". "L3" represents a case where the number of the first scattering particles distributed in the middle of the color control part is three times the number of the first scattering particles distributed in the middle of the color control part of "L1". "EQE" represents emission efficiency. "Thickness" represents the thickness of the color control part and may be parallel to the thickness direction of the display device. In other words, the thickness of the color control part may be measured in the thickness direction of the display device.

Referring to FIG. 12, if the thicknesses are the same, then the emission efficiency increases with an increase in the number of the first scattering particles distributed in the middle part. In the display device DD of an embodiment, the number of the first scattering particles SC-C distributed in the middle part may increase if the coating layer AT is formed on the partition wall part BP, and the adsorption of the first scattering particles SC-C included in the color control part CL onto the partition wall part BP is prevented or reduced. Accordingly, the deterioration of the emission efficiency of the display device DD may be prevented or reduced. In addition, due to the increase of scattering phenomenon by the substitution scattering particles SC-A, or the second scattering particles SC-X included in the coating layer AT covering the side of the partition wall part BP, improved emission efficiency of the display device DD may be provided.

The display device of an embodiment includes a coating layer covering the side of a partition wall part and may prevent or reduce the adsorption of first scattering particles onto the side of the partition wall part. In addition, the coating layer may include substitution scattering particles, or second scattering particles to increase the scattering phenomenon of light, and accordingly, improved emission efficiency of the display device may be provided.

The method for manufacturing a display device of an embodiment includes an act of forming a coating layer and may prevent or reduce the adsorption of the first scattering particles onto the side of the partition wall part. In addition, the substitution scattering particles, or the second scattering particles provided to form the coating layer may increase the scattering phenomenon of light. Accordingly, the display device manufactured by the method for manufacturing a display device of an embodiment may show improved emission efficiency properties.

The display device of an embodiment includes at least one among a substitution dispersant and substitution scattering particles in a coating layer which is adjacent to a partition wall part, thereby showing improved emission efficiency properties.

In addition, the method for manufacturing a display device of an embodiment includes an act of forming a coating layer including at least one among a substitution dispersant and substitution scattering particles and may be used for the manufacture of a display device having improved emission efficiency.

Although the exemplary embodiments of the present disclosure have been described, it is understood that the present disclosure should not be limited to these exemplary embodiments but various changes and modifications can be made by one ordinary skilled in the art within the spirit and scope of the present disclosure as set forth in the following claims and their equivalents.

What is claimed is:
1. A display device comprising:
a light-emitting element layer; and
a light control layer on the light-emitting element layer,
wherein the light control layer comprises:
a plurality of separated partition wall parts comprising a partition wall part;
a color control part between the partition wall parts, the color control part comprising quantum dots and a first scattering particle; and
a coating layer covering a side of the partition wall part adjacent to the color control part,
wherein the coating layer comprises at least one selected from a substitution dispersant and a substitution scattering particle, the substitution dispersant comprising at least one substituent selected from an amine group and a carboxyl group, the substitution scattering particle comprising at least one substituent selected from an amine group and a carboxyl group, and wherein the amine groups and the carboxyl groups comprised in the coating layer are different in number from each other.

2. The display device of claim 1, wherein the coating layer comprises the substitution dispersant and does not comprise the substitution scattering particle, and
wherein the coating layer comprises a second scattering particle that is different in substituent from the substitution scattering particle.

3. The display device of claim 2, wherein the second scattering particle comprises at least one selected from $TiO_2$, Ag, and Al.

4. The display device of claim 1, wherein the substitution dispersant comprises a polymer resin substituted with at least one selected from the amine group and the carboxyl group.

5. The display device of claim 4, wherein the polymer resin is at least one selected from polyurethane, polyethylene, polyacrylic, polyepoxy, and polyester resin.

6. The display device of claim 1, wherein the coating layer does not comprise the substitution dispersant but comprises the substitution scattering particle.

7. The display device of claim 1, wherein a surface of the first scattering particle is substituted with a ligand comprising at least one selected from an amine group and a carboxyl group, and
wherein the amine groups at the surface of the first scattering particle and the carboxyl groups at the surface of the first scattering particle are different in number from each other.

8. The display device of claim 1, wherein the first scattering particle and the substitution scattering particle are the same.

9. The display device of claim 1, wherein the coating layer further comprises a monomer, and
wherein the monomer is a urethane monomer, an ethylene monomer, an acrylic monomer, an epoxy monomer, or an ester monomer.

10. The display device of claim 1, wherein the coating layer contacts the color control part.

11. The display device of claim 1, wherein the partition wall part of the partition wall parts is separated from the color control part by the coating layer being between the partition wall part and the color control part.

12. A method for manufacturing a display device, the method comprising:
forming a color filter layer; and
forming a light control layer,
wherein the forming of the light control layer comprises:
forming a plurality of partition wall parts comprising a partition wall part;
providing a preliminary coating layer between the partition wall parts, the preliminary coating layer comprising at least one selected from a substitution dispersant and substitution scattering particles, the substitution dispersant comprising at least one substituent selected from an amine group and a carboxyl group, the substitution scattering particles comprising at least one substituent selected from an amine group and a carboxyl group;
forming a coating layer covering a side of the partition wall part by providing vacuum and heat to the preliminary coating layer; and
forming a color control part comprising quantum dots and first scattering particles between the partition wall parts on which the coating layer is formed, and
wherein the amine groups and the carboxyl groups comprised in the preliminary coating layer are different in number from each other.

13. The method for manufacturing the display device of claim 12, wherein the preliminary coating layer further comprises a solvent, and the solvent is removed with the forming of the coating layer.

14. The method for manufacturing the display device of claim 13, wherein the solvent comprises at least one selected from PGMEA, DMA, GBL, CHA, and DPMA.

15. The method for manufacturing the display device of claim 13, wherein a boiling point of the solvent is from about 50° C. to about 250° C.

16. The method for manufacturing the display device of claim 12, wherein the preliminary coating layer comprises the substitution dispersant and does not comprise the substitution scattering particles, and wherein the preliminary coating layer comprises second scattering particles that are different in substituent from the substitution scattering particles.

17. The method for manufacturing the display device of claim 16, wherein the second scattering particles are greater than about 0 wt % to less than about 5 wt % based on a total weight of the preliminary coating layer.

18. The method for manufacturing the display device of claim 12, wherein the preliminary coating layer does not comprise the substitution dispersant but comprises the substitution scattering particles.

19. The method for manufacturing the display device of claim 12, wherein the preliminary coating layer further comprises a monomer, and
wherein the monomer is applied together with a thermal curing agent or a photocuring agent.

20. The method for manufacturing the display device of claim 19, wherein the monomer is greater than about 0 wt % to less than about 5 wt % based on a total weight of the preliminary coating layer.

* * * * *